United States Patent [19]
Kim et al.

[11] Patent Number: 5,790,457
[45] Date of Patent: Aug. 4, 1998

[54] NONVOLATILE INTEGRATED CIRCUIT MEMORY DEVICES HAVING GROUND INTERCONNECT LATTICES WITH REDUCED LATERAL DIMENSIONS

[75] Inventors: Dong-jun Kim, Kyungki-do; Jeong-hyuk Choi, Seoul, both of Rep. of Korea

[73] Assignee: Samsung Electronics Co., Ltd., Suwon, Rep. of Korea

[21] Appl. No.: 989,872

[22] Filed: Dec. 12, 1997

Related U.S. Application Data

[62] Division of Ser. No. 745,731, Nov. 12, 1996, Pat. No. 5,729,491.

[51] Int. Cl.$^6$ ..................................................... G11C 11/34
[52] U.S. Cl. .............................. 365/185.17; 365/185.33
[58] Field of Search ........................... 365/185.17, 185.33

[56] References Cited

U.S. PATENT DOCUMENTS

| | | | |
|---|---|---|---|
| 5,295,096 | 3/1994 | Nakajima | 365/218 |
| 5,299,166 | 3/1994 | Suh et al. | 365/218 |
| 5,434,814 | 7/1995 | Cho et al. | 365/230.03 |
| 5,528,537 | 6/1996 | Lee et al. | 365/185.11 |
| 5,568,420 | 10/1996 | Lim et al. | 365/185.17 |
| 5,581,504 | 12/1996 | Chang | 365/185.17 |
| 5,587,948 | 12/1996 | Nakai | 365/185.17 |
| 5,661,682 | 8/1997 | Lim et al. | 365/185.17 |
| 5,671,176 | 9/1997 | Jang et al. | 365/185.02 |
| 5,734,609 | 3/1998 | Choi et al. | 365/185.17 |

*Primary Examiner*—David C. Nelms
*Assistant Examiner*—Trong Phan
*Attorney, Agent, or Firm*—Myers, Bigel, Sibley & Sajovec

[57] ABSTRACT

Nonvolatile integrated circuit memory devices having ground interconnect lattices are provided to have reduced lateral dimensions because the ground interconnect lines therein occupy less total area. With respect to integrated circuit memory devices containing NAND strings of EEPROM memory cells, the ground select electrodes for respective first and second pluralities of NAND strings (on a first side of a metal ground line) are joined together so that the number of ground select electrodes crossing the metal ground line can be reduced. The area normally occupied by the crossing ground select electrodes can then be used to interconnect the metal ground line to a substrate ground line using an interconnect via. Thus, the area normally reserved exclusively for the ground interconnect vias can be reduced or eliminated altogether by reducing the number of ground select electrodes which actually cross the metal ground line. In addition, to facilitate the connection of the metal ground line to the substrate ground line, depletion-mode transistors are formed in those areas where the ground select electrode(s) crosses the substrate ground line(s). The use of depletion-mode transistors prevents the formation of an electrical "open" between the substrate ground line and the metal ground line when the ground select electrodes are unbiased.

3 Claims, 8 Drawing Sheets

NONVOLATILE INTEGRATED CIRCUIT MEMORY DEVICES HAVING GROUND INTERCONNECT LATTICES WITH REDUCED LATERAL DIMENSIONS

This application is a division of Ser. No. 08/745,731, filed on Nov. 12, 1996 which is now U.S. Pat. No. 5,729,491, issued Mar. 17, 1998.

FIELD OF THE INVENTION

The present invention relates to integrated circuit memory devices, and more particularly to nonvolatile integrated circuit memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

Erasing of the EEPROM device may also be achieved by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell.

As will be understood by those skilled in the art, a flash EEPROM integrated circuit memory device may contain a column-by-column array of NAND strings of EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603–604 (1991); and in an article by M. Momodomi et al. entitled *An Experimental 4-Mbit CMOS EEPROM with an NAND Structured Cell*, IEEE Journal of Solid State Circuits, Vol. 24, No. 5, p. 1238 October (1989). FIGS. 1–2 herein also illustrate a conventional NAND string of EEPROM cells containing string select and ground select transistors S1 and G1 at opposing ends of the string of EEPROM cells $C_1$–$C_n$. As illustrated, the length of the string is denoted as "y", the width of the string is denoted as "x" and "d" represents the distance between the gate of the ground select transistor G1 and the ground line 1 which may constitute a stripe-shaped semiconductor region of first conductivity type (e.g., N-type) in a semiconductor substrate. The operation of NAND string, such as the strings of FIGS. 1–2, is more fully described in commonly assigned U.S. Pat. No. 5,473,563 to Suh et al. entitled *Nonvolatile Semiconductor Memory*, the disclosure of which is hereby incorporated herein by reference.

To program an EEPROM cell within a NAND string, a number of programming steps are typically performed as now described. For example, the drain of the string select transistor S1 is typically held at ground potential by applying a logic 0 potential to a bit line connected thereto. The gate of the ground select transistor G1 is also set to ground potential to maintain the ground select transistor G1 in a nonconductive (i.e., "off") state. The string select transistor S1 is then turned-on by setting the gate thereof to a logic 1 potential. This electrically connects the source (S) of the string select transistor S1 to the bit line which is at ground potential. The gate of an EEPROM cell (e.g., $C_2$) to be programmed is also set to a sufficiently high program voltage (e.g., $V_{pgm}$=18 V) to cause Fowler-Nordheim tunneling of hot electrons from the drain side of its respective channel into its respective floating gate, as described more fully hereinabove. These electrons are provided by the bit line by setting the gates of the EEPROM transistors which are not being programmed (e.g., $C_1$, $C_{n-1}$, $C_n$) to sufficiently high pass voltages (e.g., $V_{pass}$=10 V) to render these transistors conductive (i.e., "on") regardless of their programmed state (i.e., threshold voltage).

The above described NAND strings of FIGS. 1–2 may be combined to form an integrated circuit memory device containing an array of NAND strings therein. For example, FIG. 3 illustrates a layout schematic of a prior art integrated circuit memory device containing respective pluralities or groups of NAND strings which are separated into quadrants by a metal ground line (shown as connected to Vss) and a substrate ground line GL. These metal and substrate ground lines are electrically connected together by a metal-filled contact via 3 which extends from an upper layer of metallization to the substrate ground line GL. Here, the NAND strings in the upper two quadrants are mirror images of the NAND strings in the lower two quadrants and for large memory devices, the substrate and metal ground lines form an interconnect lattice or x-y coordinate grid.

As will be understood by those skilled in the art, the active region of the memory device is defined by region 5, regions SSL1 and SSL2 denote the string select signal lines (e.g., polycrystalline silicon) which interconnect the gates of the string select transistors S1 in each NAND string, WL1-WLn denote the word lines which interconnect the gates in each row of EEPROM cells and GSL1 and GSL2 denote the ground select signal lines which interconnect the gates of the ground select transistors G1 in each NAND string. As illustrated, the ground select signal lines GSL1 and GSL2 are joined external to the memory cell array. An equivalent electrical schematic of the memory device of FIG. 3 is illustrated by FIG. 4.

As illustrated best by FIG. 5, which is an enlarged layout schematic of the region defined by points A–D in FIG. 3, the ground select signal lines GSL1 and GSL2 both cross the metal ground line. The ground select signal lines GSL1 and GSL2 are also separated by a minimum array spacing "f" equal to 2a+2b+c where "a" denotes the distance between the edge of a ground select signal line 7 (e.g., polycrystalline silicon) and the active region 5, "b" denotes the spacing between the active region 5 and the contact via 3 and "c" denotes the length of the contact via 3. As with FIG. 1, "d" denotes the distance between a ground select signal line 7 and a respective closest edge of the substrate ground line GL. However, because the minimum array spacing "f" can be a significant percentage (e.g., 5–15%) of the overall length of each NAND string and because the number of groups of NAND strings in the y-direction is typically increased to achieve higher integration densities, the total amount of area needed to accommodate the minimum array spacing "f" between each group can become appreciable.

Thus, notwithstanding the above attempts to manufacture highly integrated memory devices, there still continues to be a need to more efficiently integrated memory devices.

SUMMARY OF THE INVENTION

It is therefore an object of the present invention to provide highly integrated memory devices.

It is another object of the present invention to provide integrated circuit memory devices having reduced lateral dimensions.

It is still another object of the present invention to provide integrated circuit memory devices having ground interconnect lines which occupy an area having reduced lateral dimensions.

These and other objects, features and advantages of the present invention are provided by integrated circuit memory devices which have reduced lateral dimensions because the ground interconnect lines therein are highly integrated. In particular, the present invention provides for higher integration densities of memory cells by reducing the amount of area occupied by the ground lines which interconnect the cells. For example, with respect to integrated circuit memory devices containing NAND strings of EEPROM memory cells, the ground select electrodes for respective first and second pluralities of mirror-image NAND strings on a first side of a metal ground line are joined together so that the number of ground select electrodes crossing the metal ground line can be reduced. The area normally occupied by the crossing ground select electrodes can then be used to interconnect the metal ground line to a substrate ground line using an interconnect via. Thus, the area normally reserved for the ground interconnect vias can be reduced or eliminated altogether by reducing the number of ground select electrodes which actually cross the metal ground line. In addition, to facilitate the connection of the metal ground line to the substrate ground line, depletion-mode transistors are formed in those areas where the ground select electrode(s) crosses the substrate ground line(s). The use of depletion-mode transistors prevents the formation of an electrical "open" between the substrate ground line and the metal ground line when the ground select electrodes are unbiased.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments described and illustrated herein. Rather, these embodiments are provided so that this disclosure will be thorough and complete, and will fully convey the scope of the invention to those skilled in the art.

Referring now to FIGS. 6–10, a preferred embodiment of an integrated circuit memory device according to the present invention will now be described. In particular, the illustrated portion of the memory device contains four (4) pluralities or groups of NAND strings of EEPROM memory cells which are separated from each other by a substrate ground line GL and/or metal ground line (shown as connected to Vss). The substrate ground line GL may comprise a segmented stripe-shaped region of first conductivity type (e.g., N-type) in a semiconductor substrate of second conductivity type (e.g., P-type), for example. As illustrated and described more fully hereinbelow, the metal and substrate ground lines are electrically connected together by a metal-filled contact via 16 which extends from an upper layer of metallization to the substrate ground line GL. Here, the plurality of NAND strings in the upper two quadrants are mirror images of the NAND strings in the lower two quadrants and the NAND strings in the right two quadrants are mirror images of the NAND strings in the left two quadrants. For large memory devices, the substrate and metal ground lines form an interconnect lattice or x-y coordinate grid of ground lines and the ground select transistors for the upper and lower pluralities of NAND strings, respectively, share a common segment of the substrate ground line GL.

Figure 1:
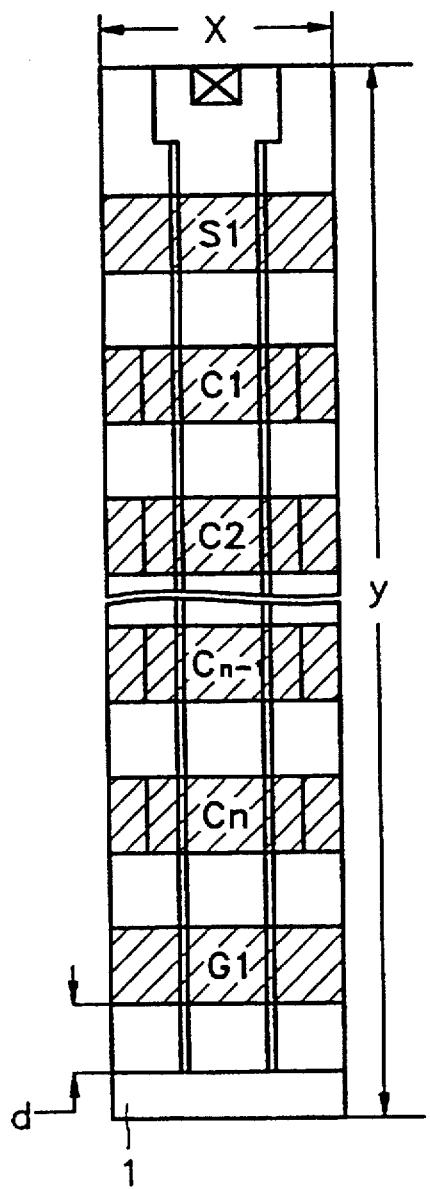
FIG. 1 illustrates a layout schematic of a NAND string of EEPROM memory cells according to the prior art.
Figure 2:
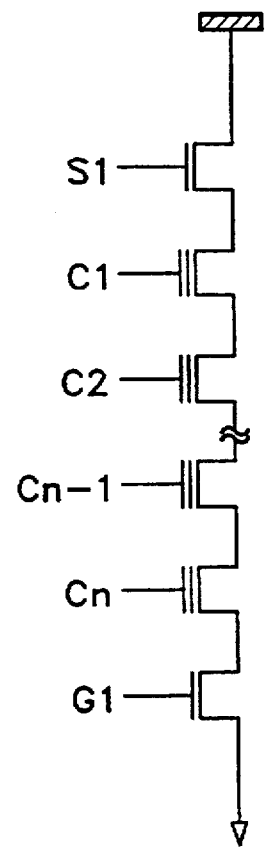
FIG. 2 illustrates an equivalent electrical schematic of the NAND string of FIG. 1.
Figure 3:
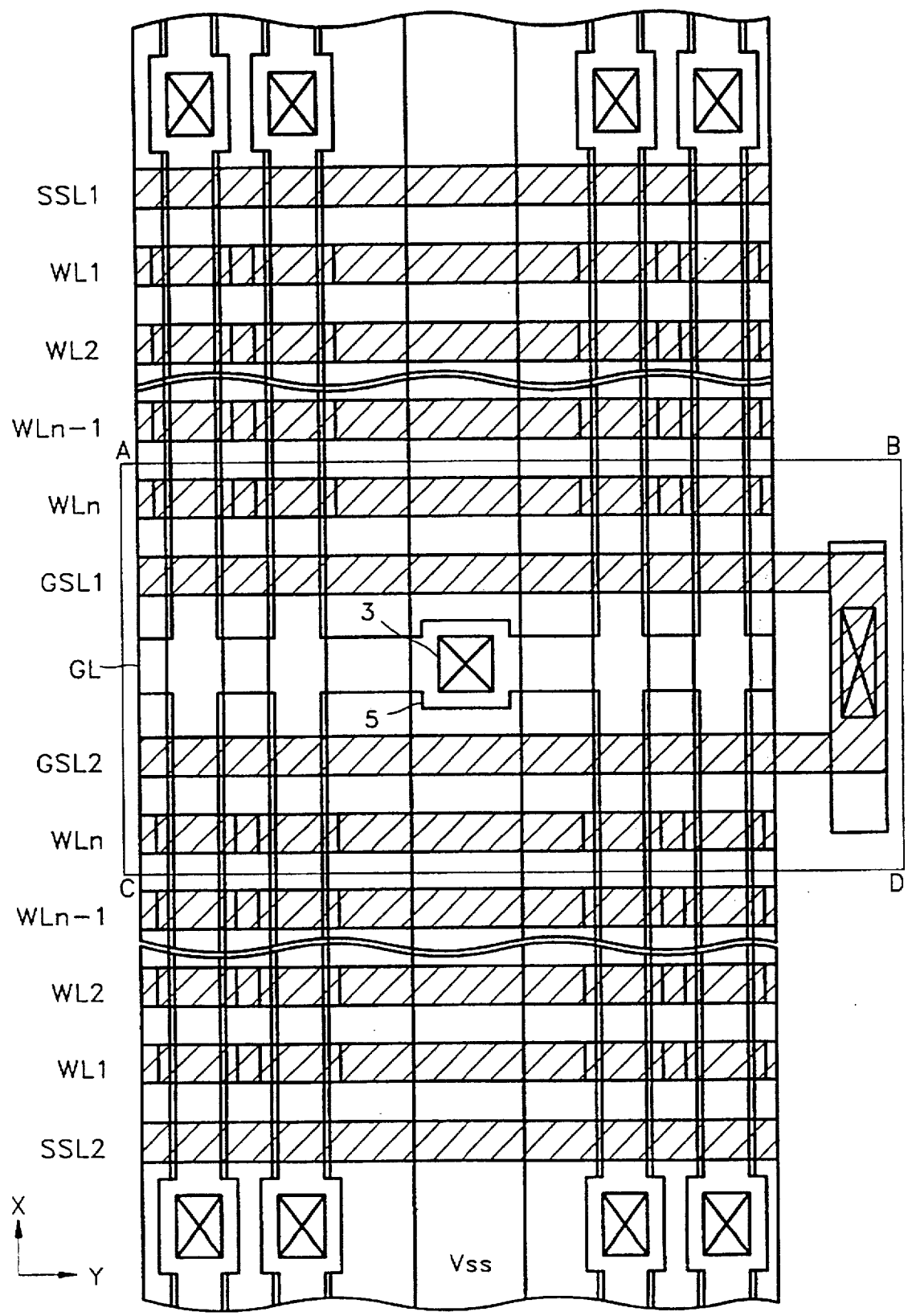
FIG. 3 illustrates a layout schematic of an integrated circuit memory device containing arrays of NAND strings therein, according to the prior art.
Figure 4:
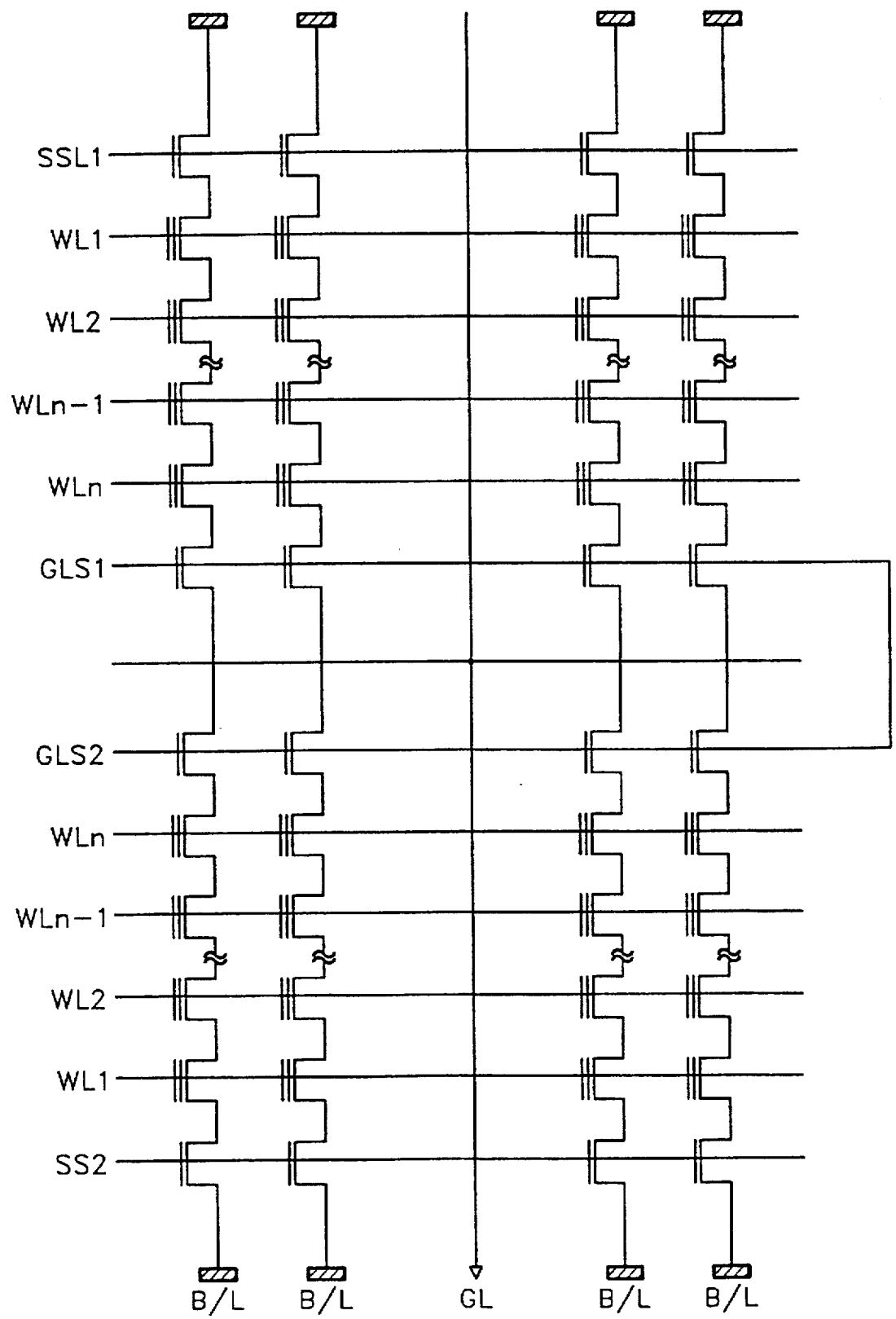
FIG. 4 illustrates an equivalent electrical schematic of the integrated circuit memory device of FIG. 3.
Figure 5:
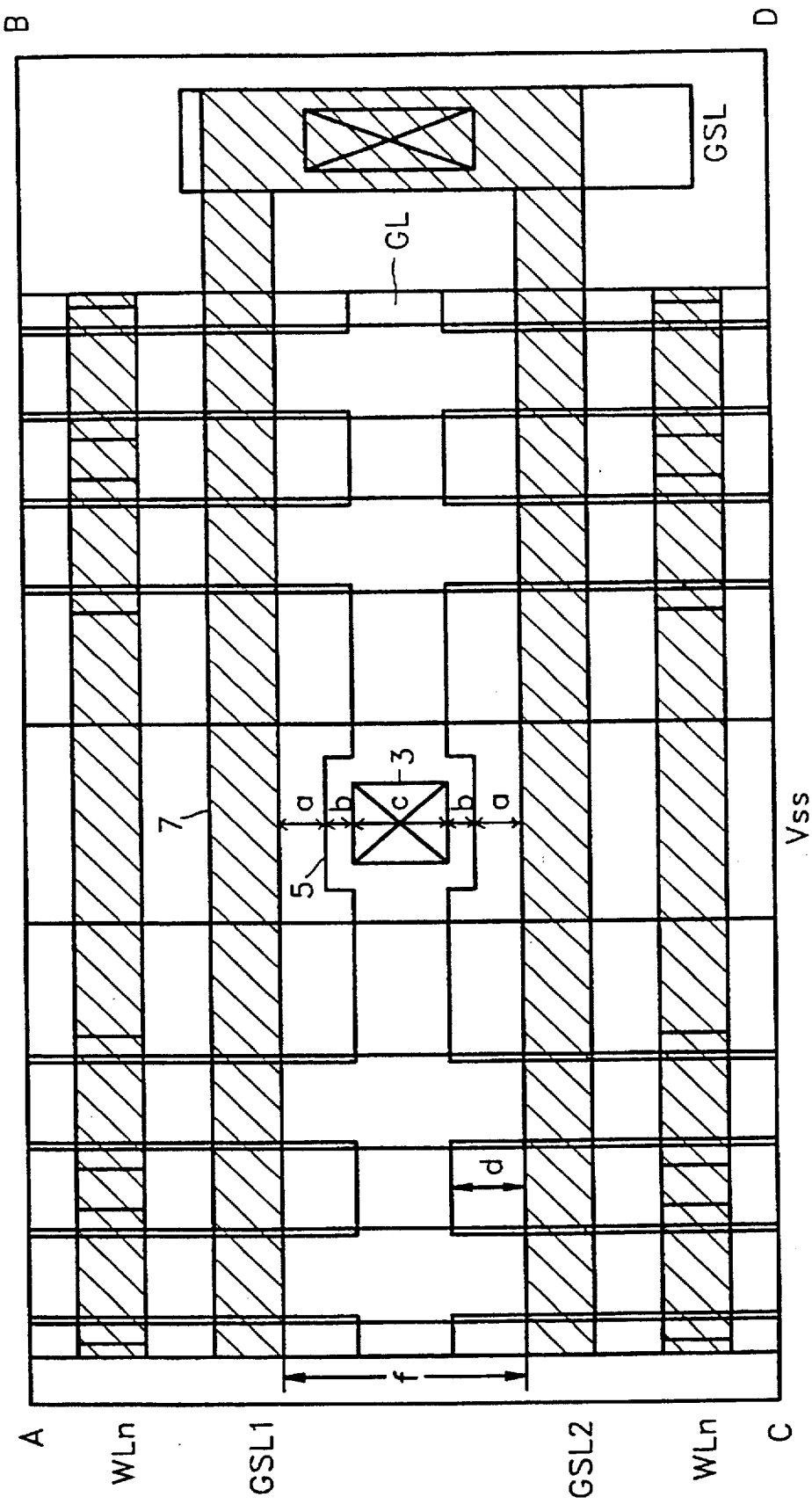
FIG. 5. illustrates an enlarged layout schematic of the region defined by points A–D in FIG. 3.
Figure 6:
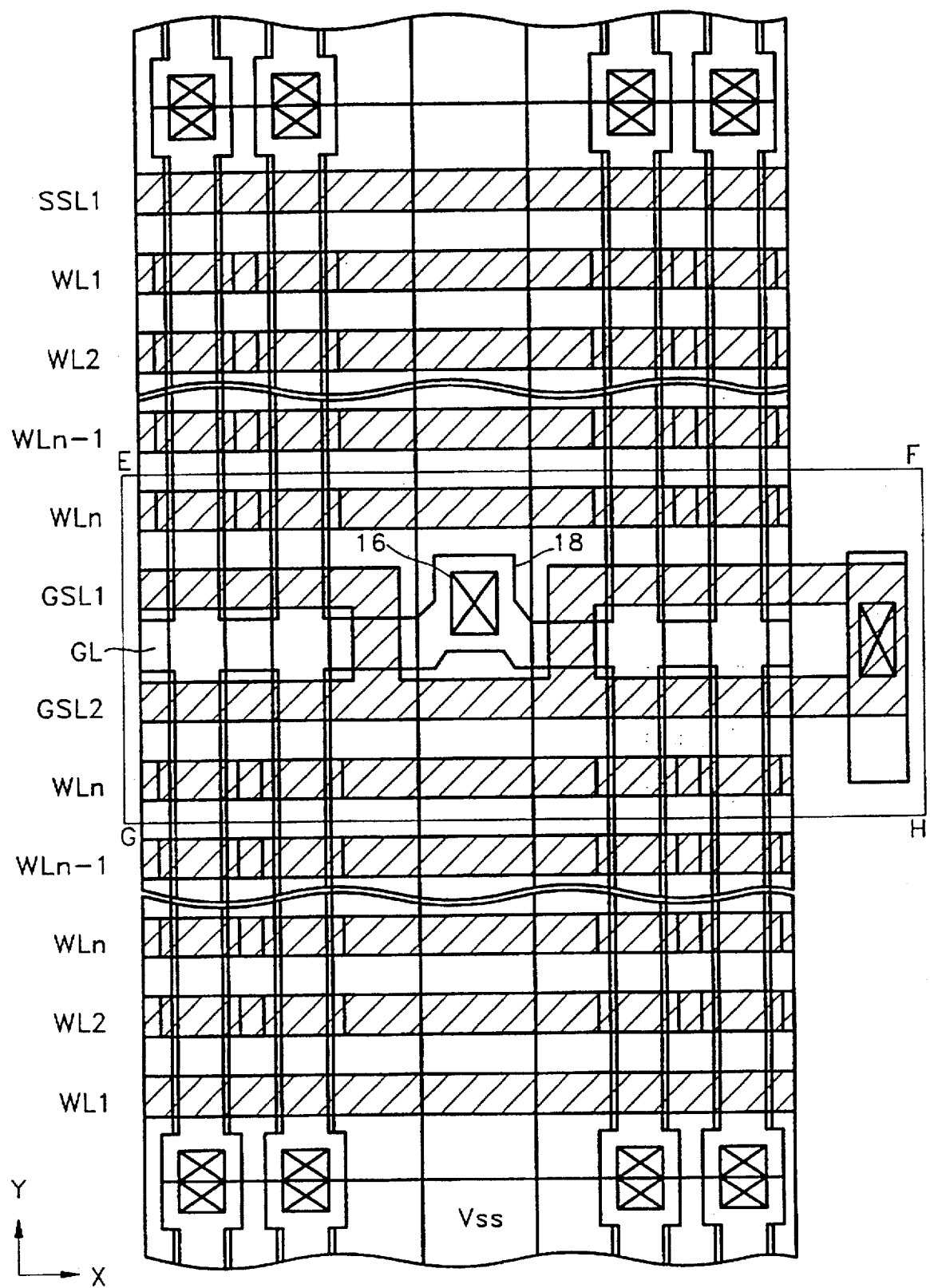
FIG. 6 illustrates a layout schematic of an integrated circuit memory device containing arrays of NAND strings therein, according to a first embodiment of the present invention.
Figure 7:
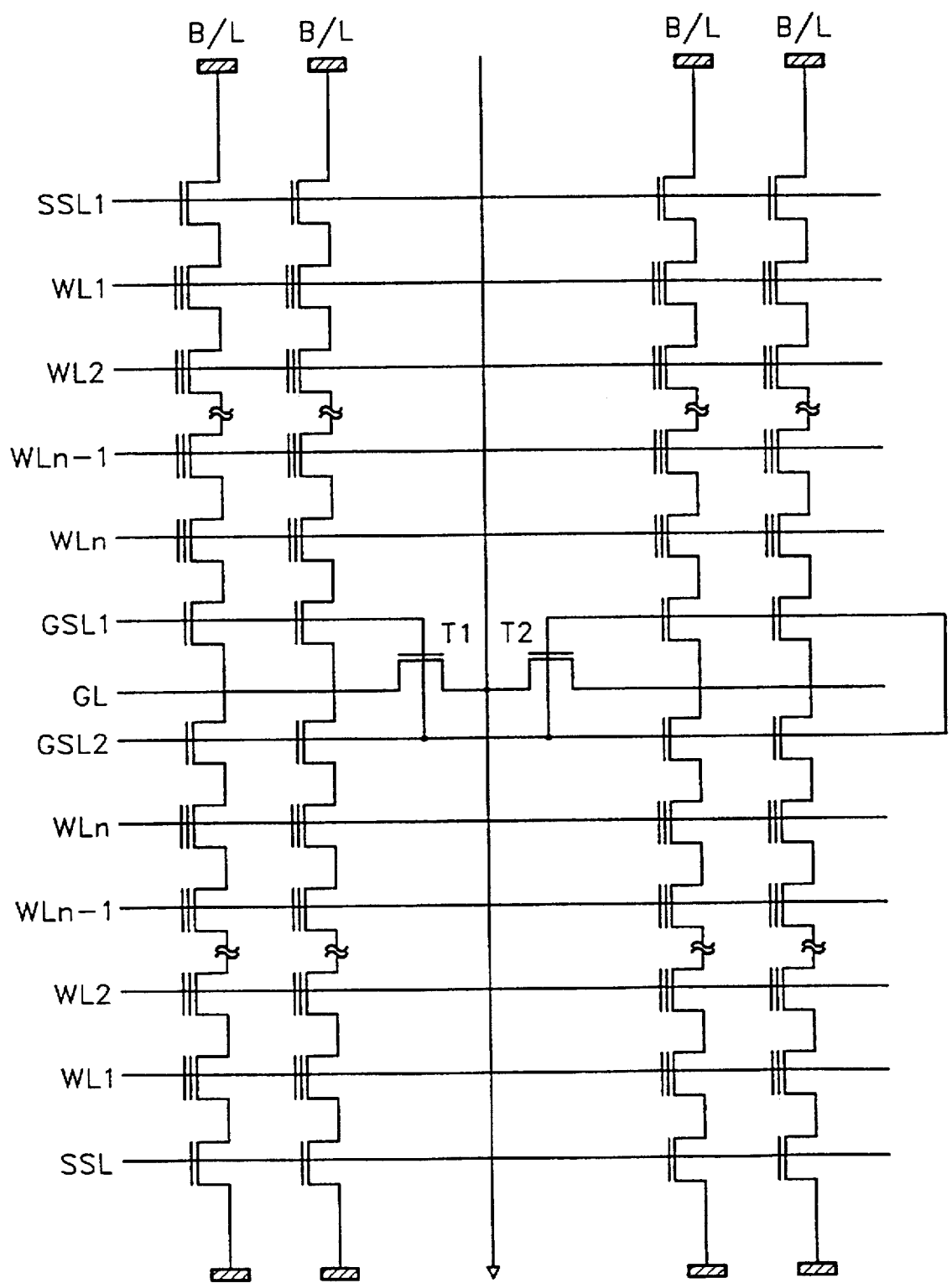
FIG. 7 illustrates an equivalent electrical schematic of the integrated circuit memory device of FIG. 6.

As will be understood by those skilled in the art, the active region of the memory device is defined by region 18, regions SSL1 and SSL2 denote the first and second string select signal lines (e.g., polycrystalline silicon) which interconnect the gates of the string select transistors in each NAND string. WL1-WLn denote the word lines (e.g., polycrystalline silicon) which interconnect the gates in each row of EEPROM cells and GSL1 and GSL2 denote the first and second ground select signal lines which interconnect the gates of the ground select transistors G1 in each NAND string. An equivalent electrical schematic of the memory device of FIG. 6 is illustrated by FIG. 7. Here, in contrast to the memory device of FIGS. 3–5, the first and second ground select signal lines GSL1 and GSL2 are joined together on both sides of the metal ground line by patterning the first ground select signal line GSL1 with a 90° corner so that it passes over the substrate ground line GL and is merged with the second ground select signal line GSL2. Moreover, to reduce the overall lateral dimensions or area occupied by the x-y grid of substrate and metal ground lines GSL1 and GSL2, the contact via 16 is patterned in the space normally occupied by a crossing first ground select signal line GSL1, without the requirement of any additional masking step. Thus, by connecting the first ground select signal line GSL1 to the second ground select signal line GSL2 on both sides of the metal ground line, so that only the second ground select signal line GSL2 is required to cross the metal ground line, significant reduction in the overall area occupied by the ground line lattice can be achieved. This advantageous reduction in area is best illustrated by FIG. 8, where the minimum array spacing "f1" is less than the minimum array spacing "f" illustrated in FIG. 5 because the combined spacing 2a1+2b1+c1 is less than 2a+2b+c and because "d1", which denotes the distance between a ground select signal line and a respective closest edge of the substrate ground line 20, is reduced relative to "d" in FIG. 5.

Moreover, because the first ground select signal line GSL1 is patterned to cross the substrate ground line GL (on both sides of the metal ground line) as illustrated, two field effect transistors are formed. However, to prevent an electrical disconnect between each of the substrate ground line segments and the contact via 16 when the ground select signal lines are unbiased, the two field effect transistors T1 and T2, illustrated best by FIG. 7, are formed as normally-on depletion-mode field effect transistors. This is preferably achieved by performing an ion-implant of arsenic (As) into the channel regions of the transistors T1 and T2 or forming deep source and drain regions and then performing a heat treatment to merge the source and drain regions together underneath the first ground select signal line GSL1.

Figure 8:
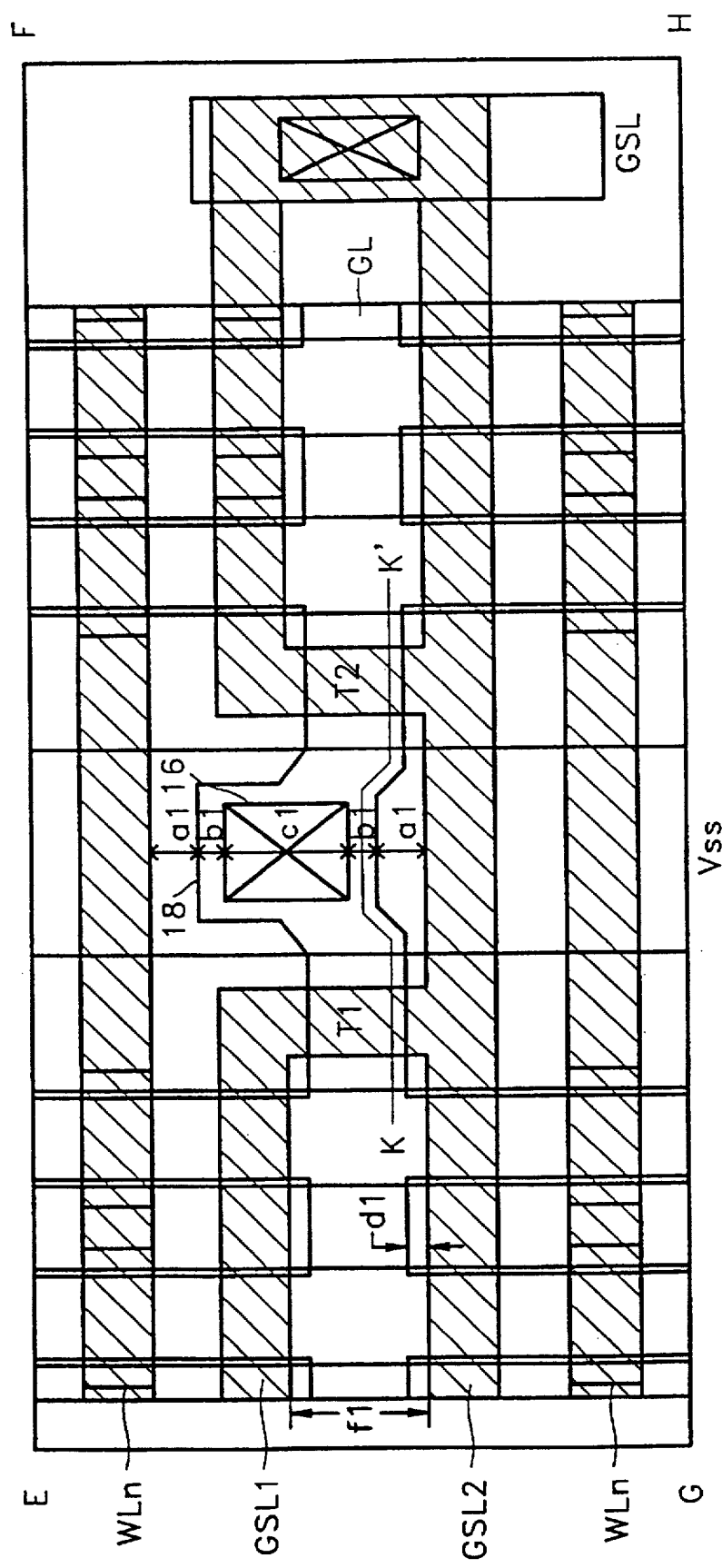
FIG. 8. illustrates an enlarged layout schematic of the region defined by points E–H in FIG. 6.
Figure 9:
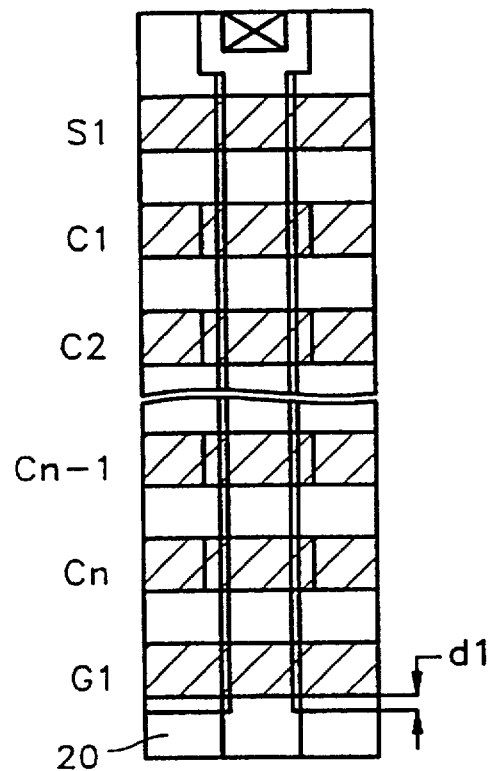
FIG. 9 illustrates an enlarged layout schematic of a NAND string in FIG. 8.
Figure 10:
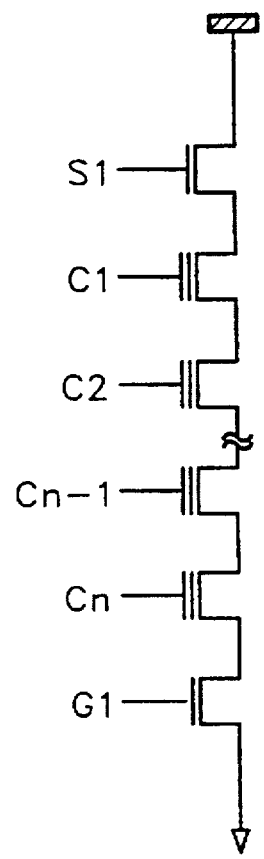
FIG. 10 illustrates an equivalent electrical schematic of the NAND string of FIG. 9.
Figure 11:
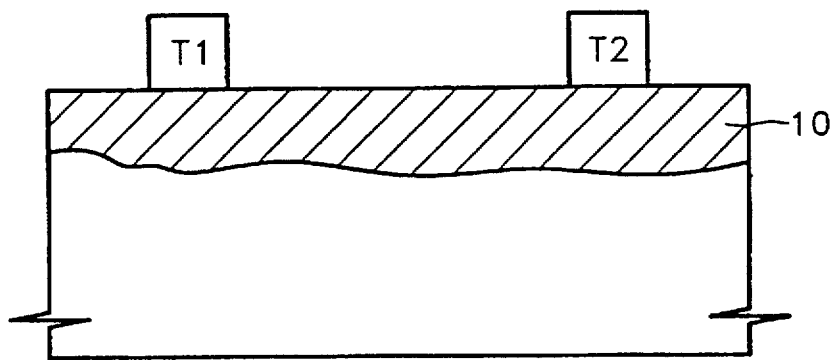
FIG. 11 is an enlarge cross-sectional view of the device of FIG. 8 taken along line K–K'.

Thus, as illustrated best by FIG. 11 which is a cross-section of the device of FIG. 8 taken along the line K–K', the substrate ground line GL is electrically connected to the contact via 16 by a continuous region 10 of first conductivity type.

Thus, the integrated circuit memory device of the present invention comprises a semiconductor substrate of predetermined conductivity type, a first NAND string of EEPROM cells in the substrate, a substrate ground line GL (e.g., N-type) electrically coupled to a source of a ground select transistor G1 in the first NAND string, a metal ground line adjacent the first NAND string and disposed at 90° relative to the substrate ground line GL. A first depletion-mode field effect transistor T1 is also provided and is electrically connected in series between the substrate ground line GL and the metal ground line and has a gate electrode electrically coupled by a first ground select signal line GSL1 to a gate electrode of the ground select transistor G1 in the first NAND string. The depletion-mode field effect transistor T1 is electrically connected in series because its drain is contiguous with the substrate ground line GL and its source is also in a region of first conductivity type which is electrically coupled to the metal ground line by a metal-filled via.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

a semiconductor substrate;

first and second pluralities of NAND strings of EEPROM memory cells in said substrate, said NAND strings containing respective string select and ground select transistors therein;

a first ground line on said substrate, between said first and second pluralities of NAND strings;

a first depletion-mode field effect transistor electrically connected in series between the first ground line and the source regions of the ground select transistors in the first plurality of NAND strings; and a second depletion-mode field effect transistor electrically connected in series between the first ground line and source regions of the ground select transistors in the second plurality of NAND strings.

2. The memory device of claim 1, further comprising a contact via electrically connected in series between source regions of said first and second depletion-mode field effect transistors and the first ground line.

3. The memory device of claim 2, wherein gate electrodes of the ground select transistors in the first plurality of NAND strings are electrically coupled to a gate electrode of said first depletion-mode field effect transistor; and wherein gate electrodes of the ground select transistors in the second plurality of NAND strings are electrically coupled to a gate electrode of said second depletion-mode field effect transistor.

* * * * *